United States Patent
Hugo et al.

(10) Patent No.: US 10,073,134 B2
(45) Date of Patent: *Sep. 11, 2018

(54) LAMINATE BOND STRENGTH DETECTION

(71) Applicant: International Business Machines Corporation, Armonk, NY (US)

(72) Inventors: Stephen M. Hugo, Stewartville, MN (US); Theron L. Lewis, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/790,845

(22) Filed: Oct. 23, 2017

(65) Prior Publication Data
US 2018/0045773 A1 Feb. 15, 2018

Related U.S. Application Data

(63) Continuation of application No. 14/987,210, filed on Jan. 4, 2016, now Pat. No. 9,910,085.

(51) Int. Cl.
*G01R 31/28* (2006.01)

(52) U.S. Cl.
CPC ..... *G01R 31/2817* (2013.01); *G01R 31/2849* (2013.01)

(58) Field of Classification Search
CPC ............ G01R 31/2874; G01R 31/2886; G01R 31/2891; G01R 31/2862; G01R 31/2831; G01R 31/2867; G01R 31/2887; G01R 31/2889; G01R 31/2893; G01R 31/31924; G01R 31/2856; G01R 31/286; G01R 31/2865; G01R 31/2868; G01R 31/2808;
(Continued)

(56) References Cited

U.S. PATENT DOCUMENTS

| | | | |
|---|---|---|---|
| 7,196,294 B2 * | 3/2007 | Hofmeister | B23K 1/0016 219/497 |
| 7,683,649 B2 * | 3/2010 | Blaney | G01R 31/2891 324/750.06 |

(Continued)

OTHER PUBLICATIONS

List of IBM Patents or Patent Applications Treated as Related; (Appendix P), Filed Oct. 23, 2017, 2 pages.

*Primary Examiner* — Thang Le
(74) *Attorney, Agent, or Firm* — Cantor Colburn LLP

(57) ABSTRACT

A laminate bond strength detection apparatus is provided. The laminate bond strength detection apparatus includes first circuit elements affixable to a printed circuit board (PCB), a housing having a coefficient of thermal expansion (CTE) mismatched from that of the PCB, second circuit elements affixable to the housing and configured to be laminated to a surface of the PCB, connectors and circuitry. The connectors respectively connect pairs of the first and second circuit elements and are breakable during CTE mismatch inducing heat processing resulting in the corresponding second circuit element becoming delaminated from the surface. The circuitry is coupled to the first and second circuit elements and configured to determine a number of broken connectors following the heat processing and to calculate a laminate bond strength of the PCB from the number of broken connectors.

20 Claims, 5 Drawing Sheets

(58) Field of Classification Search
CPC ............ G01R 31/2806; G01R 31/2805; G01R 31/2851; G01R 31/3004; G01R 31/3008; G01R 31/2884; G01R 1/0483; G01R 1/0408; G01R 1/0433; G01R 1/07307; G01R 1/30; G01R 1/07378; G01R 1/07328; G01M 99/00
USPC .... 324/750.03, 750.04, 756.05–756.07, 104, 324/105, 750.28, 757.02, 757.04, 762.02
See application file for complete search history.

(56) References Cited

U.S. PATENT DOCUMENTS

| | | | | |
|---|---|---|---|---|
| 8,030,943 B2* | 10/2011 | Spuhler | ................ | G01R 31/048 324/522 |
| 8,884,630 B2* | 11/2014 | Siddiqui | ............. | G01R 31/046 257/48 |
| 2017/0192051 A1 | 7/2017 | Hugo et al. | | |

* cited by examiner

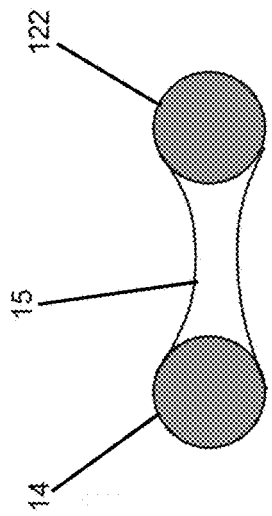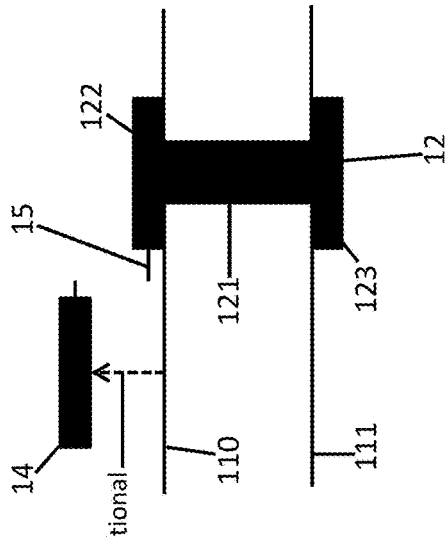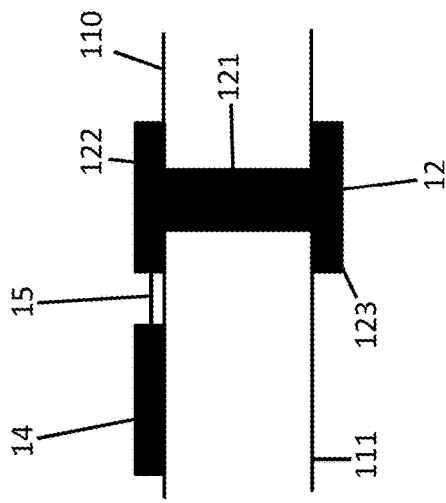

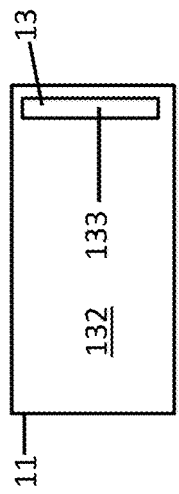
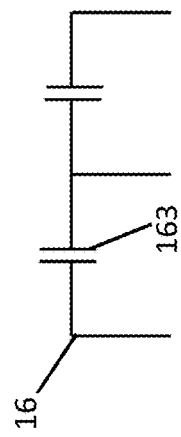
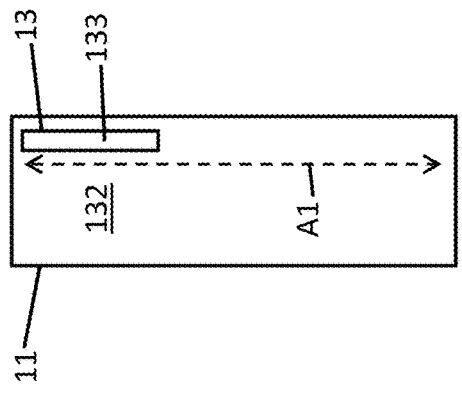
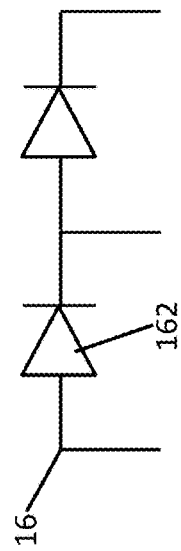

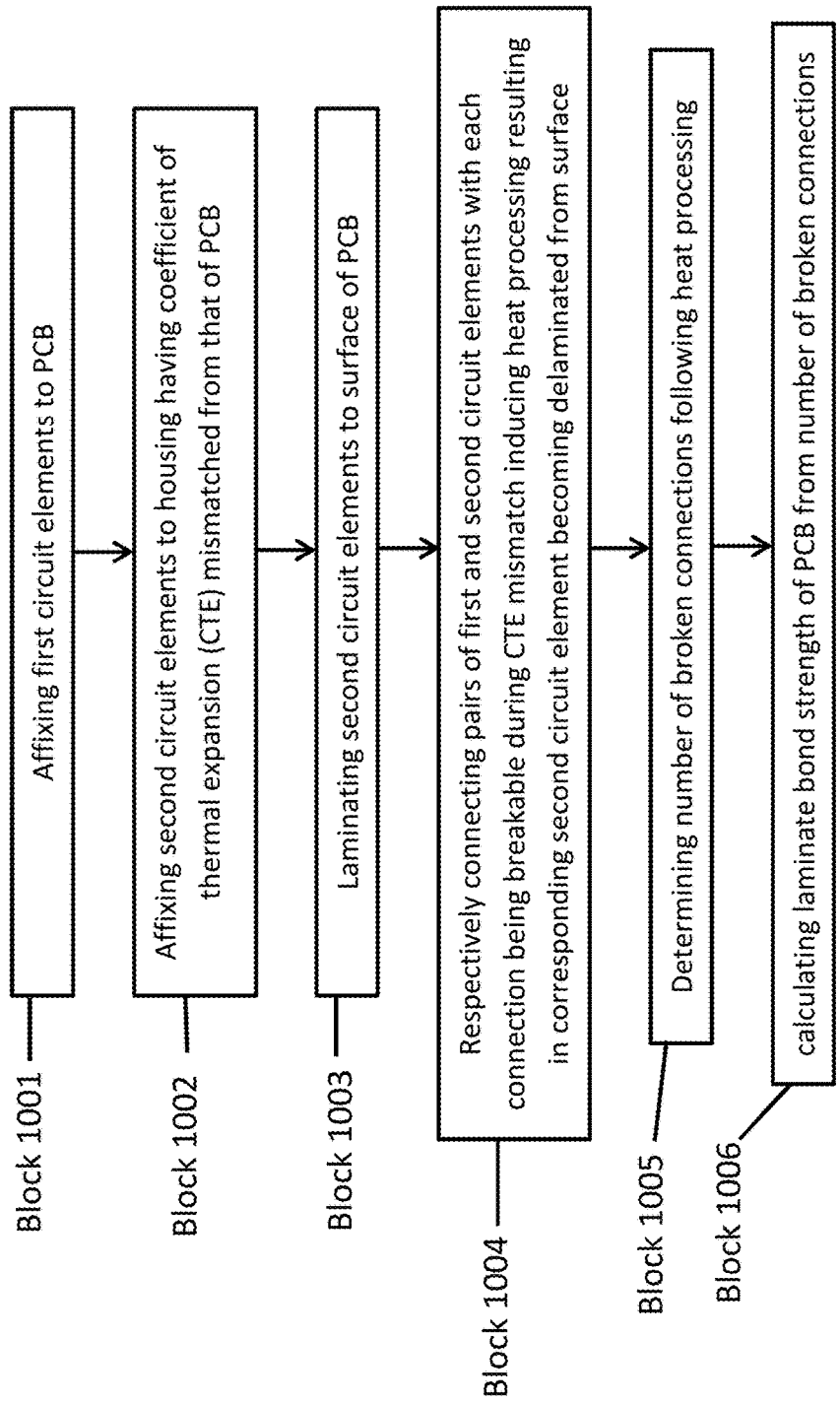

LAMINATE BOND STRENGTH DETECTION

This application is a continuation of U.S. application Ser. No. 14/987,210 which was filed on Jan. 4, 2016. The entire disclosures of U.S. application Ser. No. 14/987,210 are incorporated herein by reference.

BACKGROUND

The present invention relates to laminate bond strength detection and, more specifically, to a laminate bond strength detection apparatus, an assembly for detecting laminate bond strengths and a method of detecting a laminate bond strength of a printed circuit board (PCB).

In the production of PCBs, susceptibility of a given PCB to delamination failures due to solder assembly heat cycles is related to several factors including, but not limited to, the glass transition (Tg) properties of the PCB material and the manufacturing processes employed to form the PCB. In particular, in lead free solder assembly processes that are now most commonly used for PCB manufacturing, processing temperatures are higher than temperatures used in traditional tin/lead/eutectic soldering processes and thereby require more robust and expensive PCB lamination features. Also, since delamination during assembly is a function of a number of heat cycles employed through reflow assembly processing and since current processes used in PCB manufacturing may have high numbers of heat cycles for given PCBs, undetectable and unpredictable delamination defects can occur. Such delamination defects can result in latent field defects and product reliability problems.

Currently, destructive tests of small samples of functional PCBs or electrical tests are employed to identify delamination defects. The destructive tests can have associated costs, however, since sampling is usually done at the start of production and does not take into account drifts in process parameters. Also, even if a cross-section of a non-defective sample passes its tests, such testing would not gauge the potential variability of the non-defective sample. Electrical testing, meanwhile, may not identify delamination failures when such delamination failures are insufficient to break electrical connections on the PCBs or cause significant dielectric damage that may increase signal noise level at higher signal rates during optimal system function situations.

SUMMARY

According to an embodiment of the present invention, a laminate bond strength detection apparatus is provided. The laminate bond strength detection apparatus includes first circuit elements affixable to a printed circuit board (PCB), a housing having a coefficient of thermal expansion (CTE) mismatched from that of the PCB, second circuit elements affixable to the housing and configured to be laminated to a surface of the PCB and connectors. The connectors respectively connect pairs of the first and second circuit elements and are breakable during CTE mismatch inducing heat processing resulting in the corresponding second circuit element delaminations from the surface. A number of broken connectors following the heat processing is representative of the laminate bond strength of the PCB.

According to another embodiment of the present invention, an assembly for detecting laminate bond strengths is provided. The assembly includes a printed circuit board (PCB) having a surface, first circuit elements affixed to the PCB, a housing having a coefficient of thermal expansion (CTE) mismatched from that of the PCB, second circuit elements affixed to the housing and laminated to the surface with laminate bond strengths, connectors by which pairs of the first and second circuit elements are respectively connected and circuitry. Each connector is breakable during CTE mismatch inducing heat processing resulting in applications of delamination forces to the corresponding second circuit element leading to second circuit elements becoming delaminated from the surface where the delamination forces exceed the laminate bond strengths. The circuitry is coupled to the first and second circuit elements and configured to determine a number of broken connectors following the heat processing and to calculate a laminate bond strength of the PCB from the number of broken connectors.

According to yet another embodiment of the present invention, a method of detecting a laminate bond strength of a printed circuit board (PCB) is provided. The method includes affixing first circuit elements to the PCB, affixing second circuit elements to a housing having a coefficient of thermal expansion (CTE) mismatched from that of the PCB, laminating the second circuit elements to a surface of the PCB, respectively connecting pairs of the first and second circuit elements with each connection being breakable during CTE mismatch inducing heat processing resulting in the corresponding second circuit element becoming delaminated from the surface, determining a number of broken connections following the heat processing and calculating the laminate bond strength of the PCB from the number of broken connections.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 is a top-down view of a circuit element in accordance with embodiments;

FIG. 4 is an enlarged view of a portion of FIG. 1 prior to heat processing;

FIG. 5 is an enlarged view of the portion shown in FIG. 4 following a delamination event due to heat processing;

FIG. 6 is a top down view of a printed circuit board (PCB) with a laminate bond strength detection apparatus housing in accordance with embodiments;

FIG. 7 is a top down view of a PCB with a laminate bond strength detection apparatus housing in accordance with alternative embodiments;

FIG. 8 is a schematic diagram of an array of electrical elements of the assembly of FIGS. 1 and 2 in accordance with alternative embodiments;

FIG. 9 is a schematic diagram of an array of electrical elements of the assembly of FIGS. 1 and 2 in accordance with alternative embodiments; and FIG. 10 is a flow diagram illustrating a method of detecting a laminate bond strength of a PCB in accordance with embodiments.

DETAILED DESCRIPTION

As described later in the document, delamination or copper pad separation are previously known defect modes for printed circuit board (PCB) manufacturing. Such defects are thus employed at the PCB assembly (PCBA) level to act as a lamination strength gauge on each PCB of a particular production run so that real time measurement of each PCB can occur.

Figure 1:
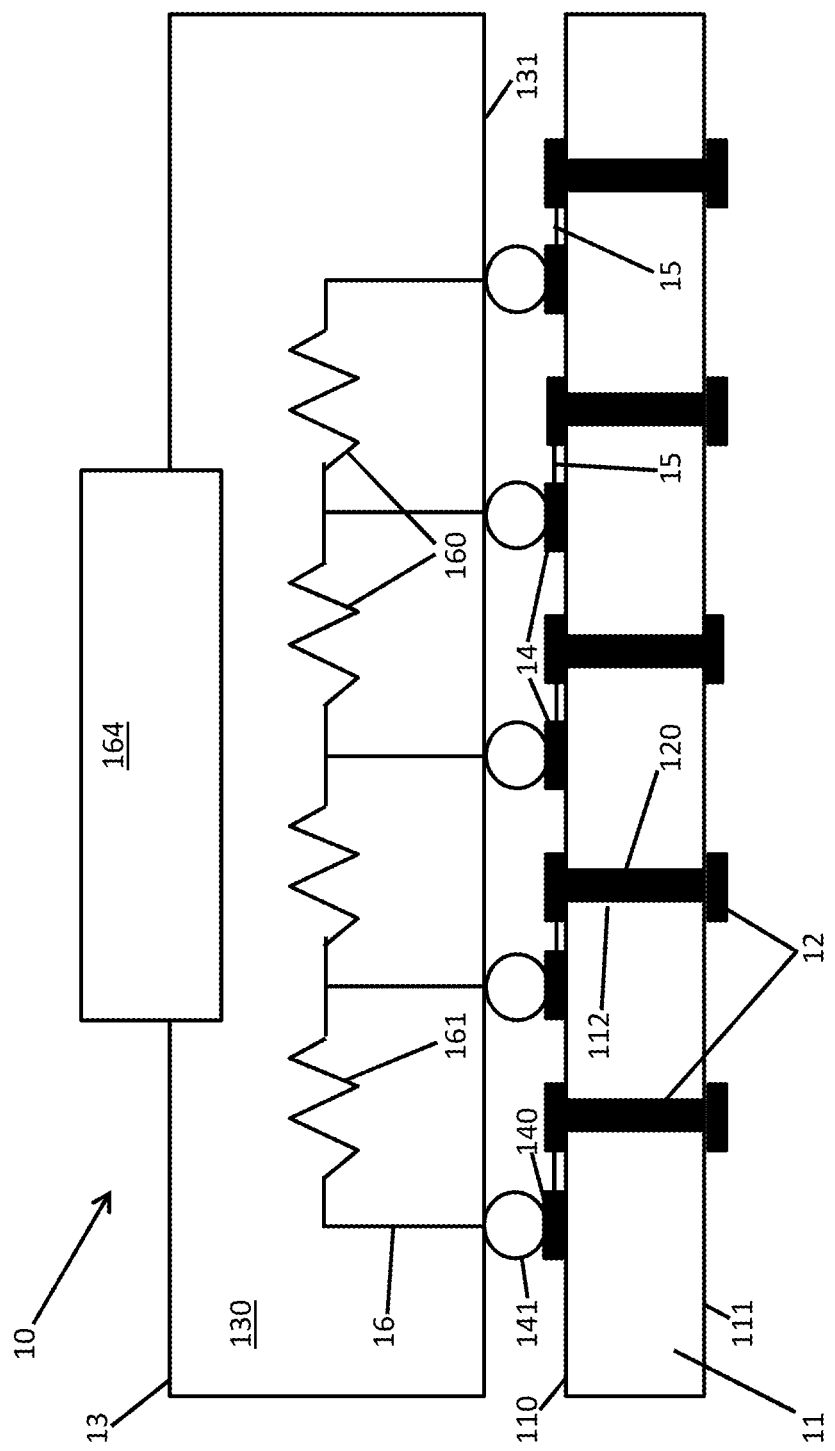
FIG. 1 is a side schematic illustration of an assembly for detecting laminate bond strengths in accordance with embodiments at an initial state.
Figure 2:
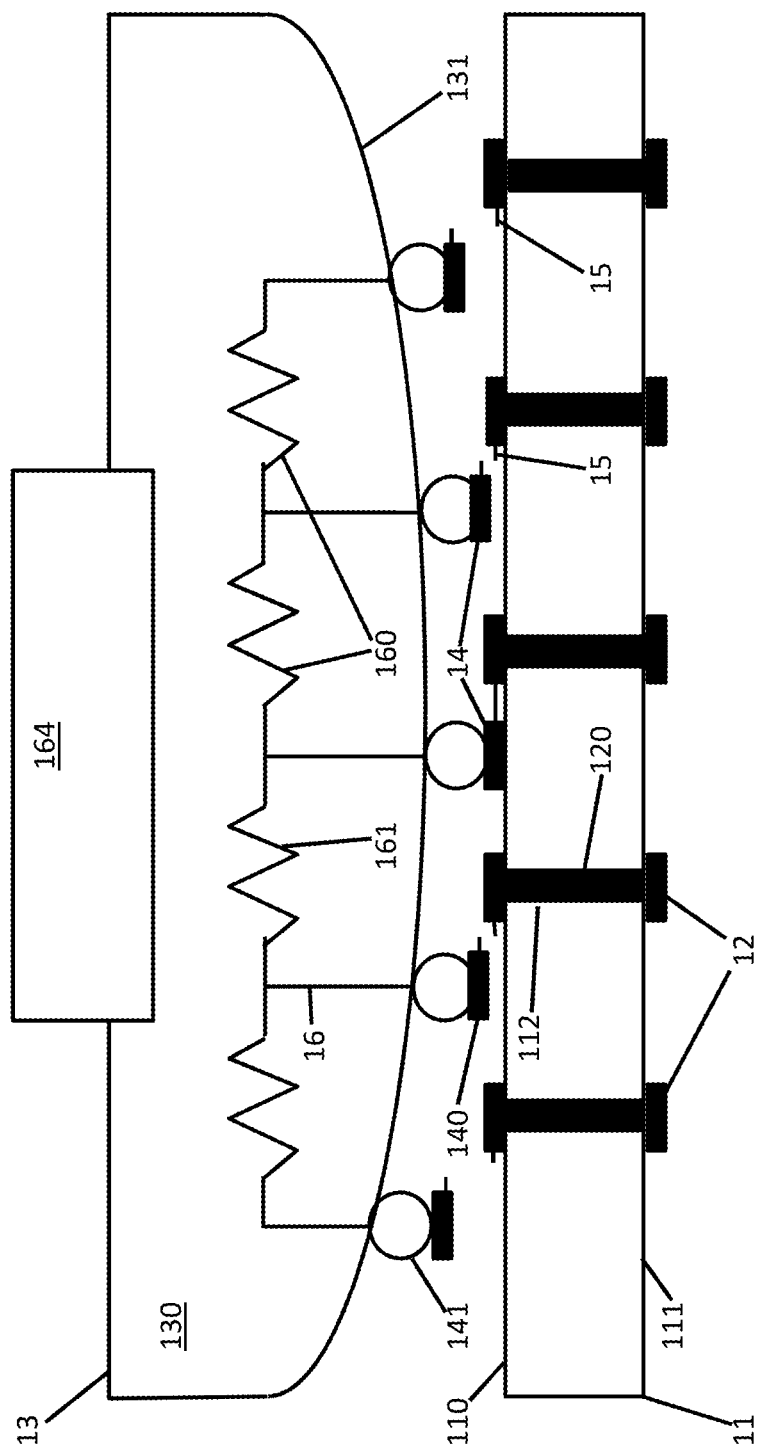
FIG. 2 is a side schematic illustration of the assembly of FIG. 1 at a post heat processing state.

With reference to FIGS. 1 and 2, an assembly 10 is provided for detecting laminate bond strengths of a PCB 11 of a PCBA. The PCB 11 is configured to mechanically support and electrically connect electronic components using conductive tracks, pads and other features etched from copper sheets laminated onto a non-conductive substrate. The PCB 11 can be single sided with one copper layer, double sided with two copper layers or multi-layered with outer and inner layers relatively high component density. The PCB 11 may be formed with plated-through holes or vias by which electrical components on different layers electrically communicate and, in certain cases, may include capacitors, resistors or active devices embedded in a substrate.

The assembly 10 includes the PCB 11, which may be effectively or functionally divided into active regions and inactive regions. Within the active regions, the PCB 11 includes various electrical elements and circuitry for performing a given set of functions. Within the inactive regions, the PCB 11 has available "real estate" for use by the assembly 10.

The PCB 11 includes first and second opposite surfaces 110 and 111, first circuit elements 12 that are affixed to the PCB 11, a housing 13 that is formed of a material having a coefficient of thermal expansion (CTE) that is mismatched from the material of the PCB 11, second circuit elements 14 that are affixed to the housing 13 and laminated to the first surface 110 of the PCB 11, connectors 15 and circuitry 16. The connectors 15 are configured to respectively connect pairs of the first and second circuit elements 12 and 14 and are breakable during CTE mismatch inducing heat processing of the PCB 11, which results in the corresponding second circuit element 14 becoming delaminated from the first surface 110. The circuitry 16 is coupled to the first and second circuit elements 12 and 14 and configured to determine a number of broken connectors 15 following the heat processing. The circuitry 16 is further configured to calculate a laminate bond strength of the PCB 11 from the determined number of broken connectors 15.

The housing 13 includes a body 130 and a lower surface 131. With the housing 13 being formed of a material that has a different CTE from that of the PCB 11, the housing 13 expands and contracts in a different pattern as compared to the PCB 11. As such, while the lower surface 131 may be disposed in parallel with the first surface 110 of the PCB 11 at an initial processing stage (see FIG. 1), the lower surface 131 may exhibit relative deformation as compared to the first surface 110 during heat processing of the PCB 11 (see FIG. 2).

With continued reference to FIGS. 1 and 2 and with additional reference to FIGS. 3-5, each of the first circuit elements 12 may include or be provided as a through hole via 120 and, in some cases, may have a dog-bone shape as shown in FIG. 3. Each of the second circuit elements 14 may, in some exemplary cases, include or be provided as a copper pad 140 and a solder ball 141 by which the copper pad 140 is affixed to the lower surface 131 of the body 130 of the housing 13. However, it is to be understood that the second circuit elements 14 can have many other suitable shapes and sizes and configurations besides the exemplary case described herein.

Where each individual first circuit element 12 includes a through hole via and has a dog bone shape, each first circuit element 12 may include a main via section 121 that extends through an aperture 112 defined to extend through an entire width of the PCB 11 from the first surface 110 to the second surface 111, a first end section 122 and a second end section 123. The first end section 122 is electrically coupled to a first end of the main via section 121 and at least at an initial processing state abuts the first surface 110. The second end section 123 is electrically coupled to a second end of the main via section 121 and abuts the second surface 111. Both the first end section 122 and the second end section 123 have widths that exceed the widths of the main via section 121 and the aperture such that the first circuit element 12 is secured in place relative to the PCB 11 at least at the initial processing state abuts the first surface 110.

The copper pad 140 of the corresponding second circuit element 14 is laminated to the first surface 110 and is connected to the first end section 122 by the corresponding connector 15. The connector 15 may include or be provided as a bridge of electrically conductive material, such as copper, extending from a sidewall of the first end section 122 to a complementary sidewall of the copper pad 140. As shown in FIG. 5, during a delamination event that may occur as a result of the heat processing of the PCB 11 and the corresponding relative deformation of the housing 13, z-directional forces generated by the deformation of the housing 13 are exerted on the copper pad 140 and overpower the strength of the lamination between the copper pad 140 and the first surface 110. The copper pad 140 thus becomes delaminated from the first surface 110 and subsequently recedes from the first surface 110. Such relative movement of the copper pad 140 and the first end section 122 generates a strain in the connector 15 and thereby causes the connector 15 to fracture at some point along its respective length.

In accordance with embodiments, the connector 15 may be formed such that the timing of the fracturing corresponds very closely to the timing of the delamination of the copper pad 140 from the first surface 110. As such, the assembly 10 may avoid a case where a delaminated copper pad 140 remains connected to the corresponding first end section 122 due to an unbroken connector 15 in a false negative type of incident.

With reference to FIGS. 6 and 7, exemplary embodiments of the housing 13 will now be described but it will be understood that such description is exemplary and not intended to limit the scope of the invention in any way. As shown in FIG. 6, both the PCB 11 and the housing 13 may be respectively provided as elongate body 132 and 133 such that the PCB 11 and the housing 13 have similar shapes. Alternatively, as shown in FIG. 7, the PCB 11 and the housing 13 may have differing shapes. In these or other cases, the housing 13 may include at least one or more lines of second circuit elements 14 (for connection to at least one or more complementarily positioned lines of first circuit elements 12 on the PCB 11) extending in parallel with a longitudinal axis A1 of the housing 13.

With reference back to FIGS. 1 and 2 and, with additional reference to FIGS. 8 and 9, the circuitry 16 includes an array of electrical elements 160 that may be arranged in series, as shown in FIG. 1, or in some other suitable arrangement. The electrical elements 160 may be provided as resistors 161 (see FIGS. 1 and 2), diodes 162 (see FIG. 8), capacitors 163 (see FIG. 9), PN junctions to ground or some other similar type of electrical elements. The circuitry 160 may further include a computing device 164, which is disposed in signal communication with the array of electrical elements 160.

The computing device 164 may include a central processing unit and a memory unit having executable instructions stored thereon. The executable instructions, when executed, cause the processing unit to determine a number of broken connectors 15 following the heat processing of the PCB 11 and to calculate the laminate bond strength of the PCB 11 from the number of broken connectors 15. That is, where the array of electrical elements 160 is provided as an array of resistors 161 in series, the number of broken connectors 15 will be determined from in-circuit-test (ICT) measurements of a change in the total resistance of the array of electrical elements 160 from a time prior to the heat processing of the PCB 11 (see FIG. 1) to a time following the heat processing of the PCB 11 and the relative deformation of the housing 13 (see FIG. 2).

Although FIGS. 1 and 2 illustrate five ICT locations, it is to be understood that this is being done for clarity and brevity in the drawings and that many more ICT locations may be provided on each PCB 11. Moreover, it is to be further understood that an increase in a number of ICT locations on a given PCB 11 provides for increased test accuracies and a graduated test scale that can measure strengths more accurately and at more locations on the PCB 11. In addition, with the assembly 10 being disposable on each PCB 11 of a given or particular processing run, the effective measurement of the laminate bond strength of each PCB 11 provides for statistical process control (SPC) predictability of laminate weaknesses.

With reference to FIG. 10, a method of detecting a laminate bond strength of a PCB is provided and includes affixing first circuit elements to the PCB at block 1001, affixing second circuit elements to a housing having a coefficient of thermal expansion (CTE) mismatched from that of the PCB at block 1002, laminating the second circuit elements to a surface of the PCB at block 1003, respectively connecting pairs of the first and second circuit elements with each connection being breakable during CTE mismatch inducing heat processing resulting in the corresponding second circuit element becoming delaminated from the surface at block 1004, determining a number of broken connections following the heat processing at block 1005 and calculating the laminate bond strength of the PCB from the number of broken connections (by, e.g., conducting SPC for achieving increased predictability) at block 1006.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A laminate bond strength detection apparatus, comprising:
    a printed circuit board (PCB);
    a housing having a coefficient of thermal expansion (CTE) mismatched from that of the PCB; and
    connectors operably interposed between the PCB and the housing, each of the connectors being breakable during CTE mismatch inducing heat processing of at least one of the PCB and the housing,
    wherein a number of broken connectors following the CTE mismatch inducing heat processing is representative of a laminate bond strength parameter of the PCB.

2. The laminate bond strength detection apparatus according to claim 1, further comprising:
    first circuit elements affixable to the PCB, each of the first circuit elements comprising a through hole via; and
    second circuit elements affixable to the housing, each of the second circuit elements being configured to be laminated to a surface of the PCB.

3. The laminate bond strength detection apparatus according to claim 2, wherein each of the first circuit elements has a dog-bone shape.

4. The laminate bond strength detection apparatus according to claim 2, wherein each of the second circuit elements comprises a copper pad and a solder ball by which the copper pad is affixed to the housing.

5. The laminate bond strength detection apparatus according to claim 1, wherein the housing is elongate.

6. The laminate bond strength detection apparatus according to claim 1, wherein the housing has a shape which is similar to that of the PCB.

7. The laminate bond strength detection apparatus according to claim 1, further comprising circuitry configured to:
    determine the number of broken connectors, and
    calculate the laminate bond strength of the PCB from the number of broken connectors.

8. The laminate bond strength detection apparatus according to claim 7, wherein the circuitry comprises one or more of resistors, inverters and capacitors.

9. The laminate bond strength detection apparatus according to claim 1, wherein a breakage timing of each of the connectors corresponds closely to a timing of a delamination event.

10. An assembly for detecting laminate bond strengths, the assembly comprising:
    a printed circuit board (PCB) having a surface;
    a housing having a coefficient of thermal expansion (CTE) mismatched from that of the PCB;
    connectors operably interposed between the PCB and the housing, each of the connectors being breakable during CTE mismatch inducing heat processing of at least one of the PCB and the housing; and
    circuitry configured to determine a number of broken connectors following the CTE mismatch inducing heat processing and to calculate a laminate bond strength of the PCB from the number of broken connectors.

11. The assembly according to claim 10, further comprising:
    first circuit elements affixable to the PCB, each of the first circuit elements comprising a through hole via; and
    second circuit elements affixable to the housing, each of the second circuit elements being configured to be laminated to a surface of the PCB.

12. The assembly according to claim 11, wherein each of the first circuit elements has a dog-bone shape.

13. The assembly according to claim 11, wherein each of the second circuit elements comprises a copper pad and a solder ball by which the copper pad is affixed to the housing.

14. The assembly according to claim 10, wherein the housing is elongate.

15. The assembly according to claim 10, wherein the housing has a shape which is similar to that of the PCB.

16. The assembly according to claim 10, wherein the circuitry comprises an array of electrical elements.

17. The assembly according to claim 16, wherein the electrical elements comprise one or more of resistors, inverters and capacitors.

18. The assembly according to claim 10, wherein a breakage timing of each of the connectors corresponds closely to a timing of a delamination event.

19. A method of detecting a laminate bond strength of a printed circuit board (PCB), the method comprising:
  operably interposing connectors between a printed circuit board (PCB) and a housing;
  providing each connector to be breakable during CTE mismatch inducing heat processing of at least one of the PCB and the housing;
  determining a number of broken connections following the CTE mismatch inducing heat processing; and
  calculating the laminate bond strength of the PCB from the number of broken connections.

20. The method according to claim 19, wherein the calculating comprises conducting statistical process control.

\* \* \* \* \*